(12) United States Patent
Kamins

(10) Patent No.: US 7,803,698 B2
(45) Date of Patent: Sep. 28, 2010

(54) METHODS FOR CONTROLLING CATALYST NANOPARTICLE POSITIONING AND APPARATUS FOR GROWING A NANOWIRE

(75) Inventor: Theodore I. Kamins, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 650 days.

(21) Appl. No.: 11/697,818

(22) Filed: Apr. 9, 2007

(65) Prior Publication Data

US 2008/0246123 A1 Oct. 9, 2008

(51) Int. Cl.
*H01L 21/20* (2006.01)
*H01L 21/36* (2006.01)

(52) U.S. Cl. .............. 438/478; 438/618; 438/735; 438/736

(58) Field of Classification Search .............. 438/478, 438/618, 735, 736
See application file for complete search history.

(56) References Cited

U.S. PATENT DOCUMENTS

| | | |
|---|---|---|
| 6,831,017 B1 | 12/2004 | Li et al. |
| 7,087,920 B1 | 8/2006 | Kamins |
| 7,105,428 B2 | 9/2006 | Pan et al. |
| 2005/0167651 A1 | 8/2005 | Merkulov et al. |
| 2005/0170553 A1 | 8/2005 | Merkulov et al. |
| 2005/0176228 A1 | 8/2005 | Fonash et al. |
| 2008/0153242 A1* | 6/2008 | Daniel et al. ............... 438/308 |

OTHER PUBLICATIONS

Islam et al., "A Novel Interconnecation Technique for Manufacturing Nanowire Devices", Appl. Phys. A 80 (2005), pp. 1133-1140.
Islam et al., "Ultrahigh-Density Silicon Nanobridges Formed Between Two Vertical Silicon Surfaces", Nanotechnology 15 (2004) pp. L5-L8.
Senez, et al. "Analysis and Application of a Viscoelastic Model for Silicon Oxidation", J. Appl. Phys. 76 (6), Sep. 15, 1994, pp. 3285-3296.
Sharma et al., "Diameter Control of Ti-Catalyzed Silicon Nanowires", Journal of Crystal Growth 267 (2004), pp. 613-618.
Yamabe et al. "Nonplanar Oxidation & Reduction of Oxide Leakage Currents at Silicon Corners by Rounding-Off Oxidation", IEEE Trans on Elec. Dev,V.ED-34,No. 8,Aug. 8, 1987,pp. 1681-1687.
Yasseri, et al. "Growth and Use of Metal Nanocrystal Assemblies on High Density Silicon Nanowires Formed by Chemical Vapor Deposition", Appl. Phys. A (2005), pp. 659-664.
Sharma, et al. "Synthesis of Thin Silicon Nanowires Using Gold-Catalyzed Chemical Vapor Deposition", Appl. Phys. A 80 (2005), pp. 1225-1229.
Kamins, et al. "Ti-Catalyzed Si Nanowires by Chemical Vapor Deposition: Microscopy and Growth Mechanisms", J. Appl. Phys., vol. 89, No. 2, Jan. 15, 2001, pp. 1008-1016.

\* cited by examiner

*Primary Examiner*—Thien F Tran

(57) ABSTRACT

A method for controlling catalyst nanoparticle positioning includes establishing a mask layer on a post such that a portion of a vertical surface of the post remains exposed. The method further includes establishing a catalyst nanoparticle material on the mask layer and directly adjacent at least a portion of the exposed portion of the vertical surface.

14 Claims, 6 Drawing Sheets

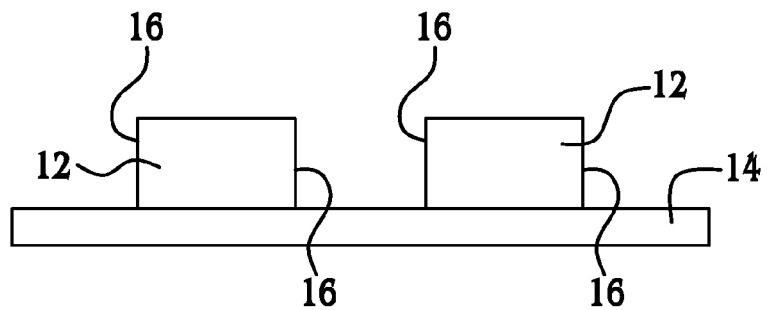
FIG. 1
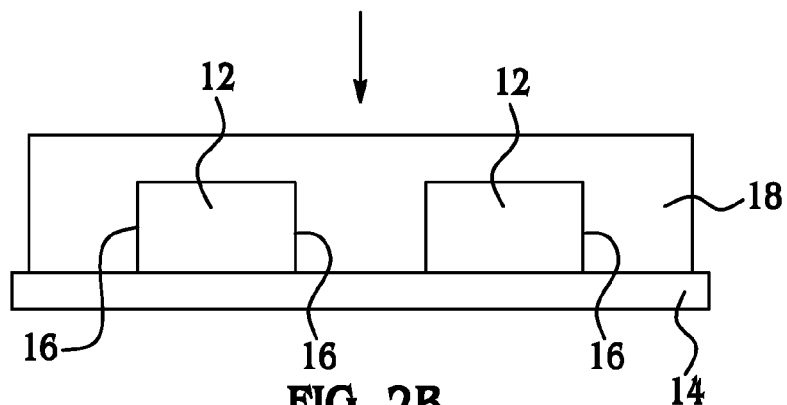
FIG. 2A
FIG. 2B
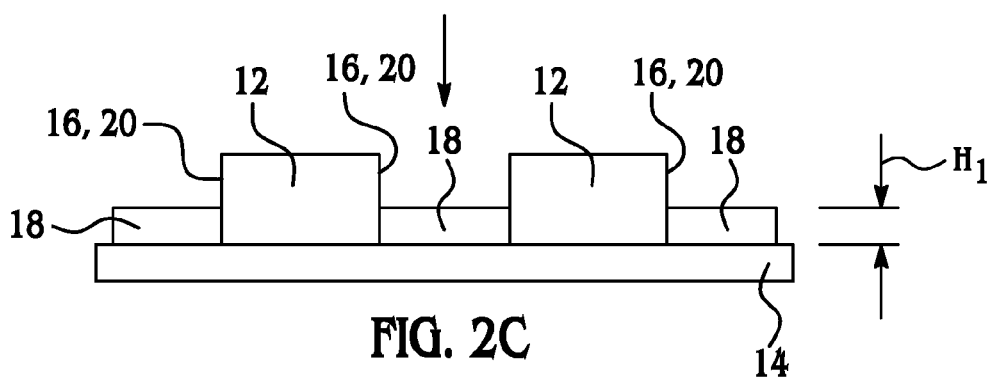
FIG. 2C
TO FIG. 2D

TO FIG. 3E

FROM FIG. 3H

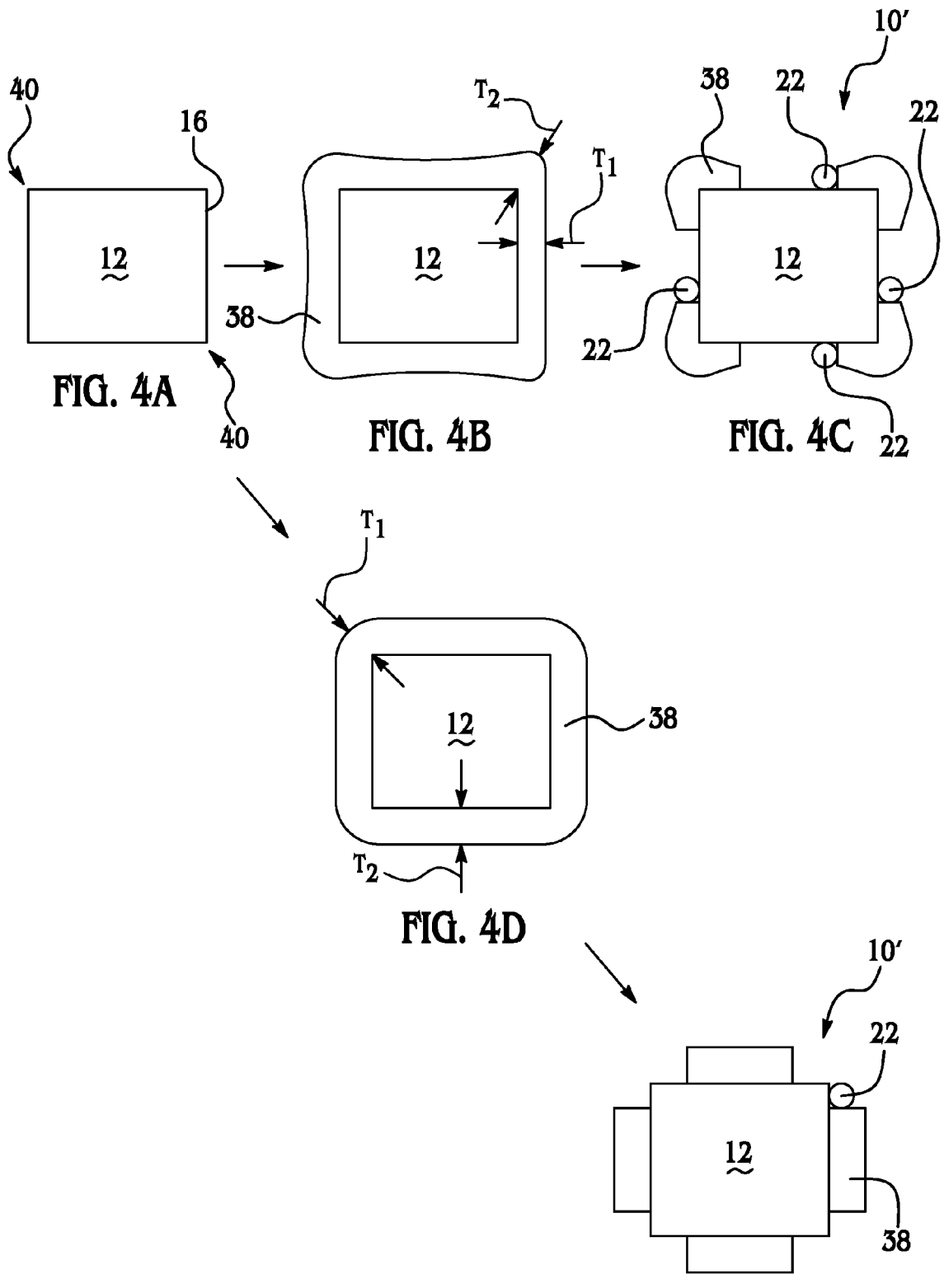

METHODS FOR CONTROLLING CATALYST NANOPARTICLE POSITIONING AND APPARATUS FOR GROWING A NANOWIRE

BACKGROUND

The present disclosure relates generally to methods for controlling catalyst nanoparticle positioning, and to an apparatus for growing a nanowire.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures. Nanowires are included in the category of nano-scale structures.

Nanowires are wire-like structures having at least one linear dimension (e.g., diameter) ranging from about 3 nm to about 200 nm. Nanowires are suitable for use in a variety of applications, including functioning as conventional wires for interconnection applications or as semiconductor devices. Nanowires are also the building blocks of many potential nano-scale devices, such as nano-scale field effect transistors (FETs), p-n diodes, light emitting diodes (LEDs) and nanowire-based sensors, to name a few.

Nanowires may be grown from catalyst nanoparticles. The positioning of such nanoparticles on vertical surfaces is generally not controlled. This lack of control may make it difficult to position the nanoparticles at a desirable distance from a lower region of the vertical surface. In some instances, the lower bound of the nanoparticle position may be controlled; however, such limited control often results in the random positioning of nanoparticles in a top region of the vertical surface. Furthermore, catalyst nanoparticles often form on undesired regions of the substrate where such nanoparticles lead to unwanted nanowire growth, requiring complicated subsequent processing to remove them and obtain the desired structure.

BRIEF DESCRIPTION OF THE DRAWINGS

Features and advantages of embodiments of the present disclosure will become apparent by reference to the following detailed description and drawings, in which like reference numerals correspond to similar, though not necessarily identical, components. For the sake of brevity, reference numerals or features having a previously described function may not necessarily be described in connection with other drawings in which they appear.

FIG. 1 is a flow diagram depicting an embodiment of the method for controlling positioning of a catalyst nanoparticle;

FIGS. 2A through 2G depict a schematic flow diagram of one embodiment of the method for controlling positioning of a catalyst nanoparticle;

FIGS. 4A through 4C depict a top view of a schematic flow diagram of still another embodiment of the method for controlling positioning of a catalyst nanoparticle; and FIGS. 4A, 4D and 4E together depict a top view of a schematic flow diagram of yet another embodiment of the method for controlling positioning of a catalyst nanoparticle.

DETAILED DESCRIPTION

Figure 2D:
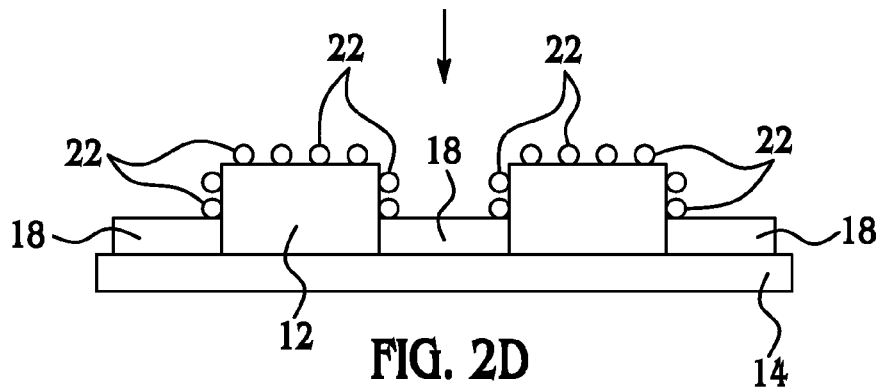

Embodiments of the method disclosed herein advantageously enable control over the positioning of one or more catalyst nanoparticles, and the nanowire(s) grown therefrom, on a vertical sidewall. Such control enables the catalyst nanoparticles to be positioned a desirable distance from a lower region of the vertical sidewall. Such control also enables desirable positioning along the sidewall, as opposed to random positioning.

Referring now to FIG. 1, one embodiment of the method for controlling catalyst nanoparticle positioning is depicted. The method includes establishing a mask layer on a post such that a portion of a vertical surface of the post remains exposed, as shown at reference numeral 11; and establishing a catalyst nanoparticle material on the mask layer and directly adjacent at least a portion of the exposed portion of the vertical surface, as shown at reference numeral 13. It is to be understood that this and other embodiments of the method and apparatus are described in further detail in reference to the other figures hereinbelow.

Figure 2E:
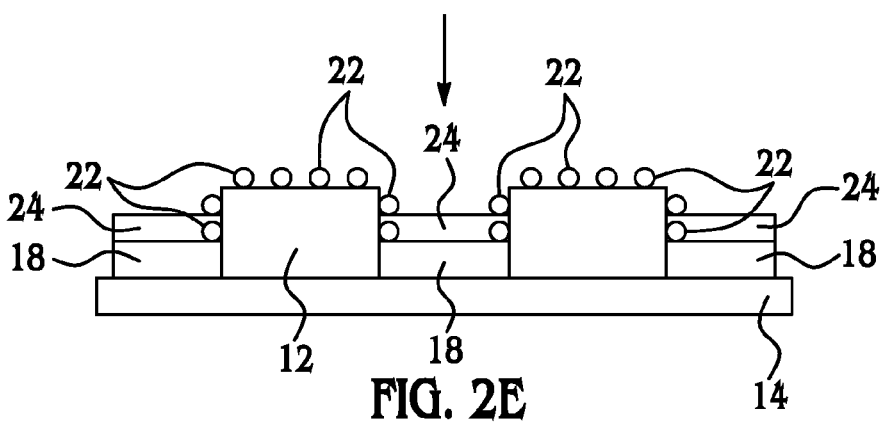
Figure 2F:
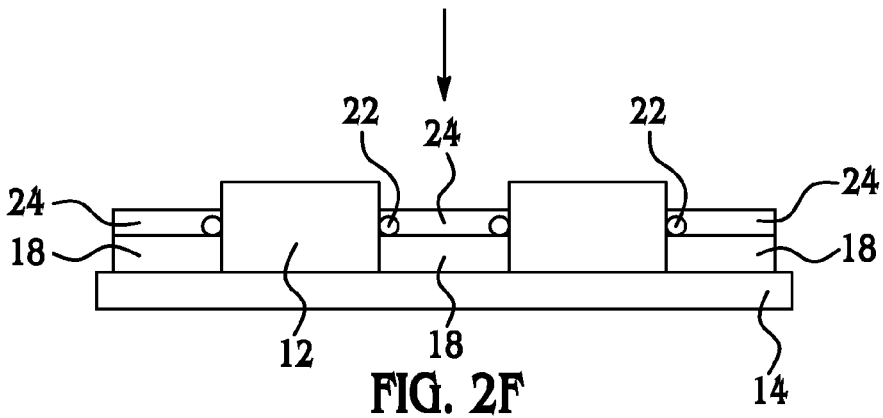
Figure 2G:
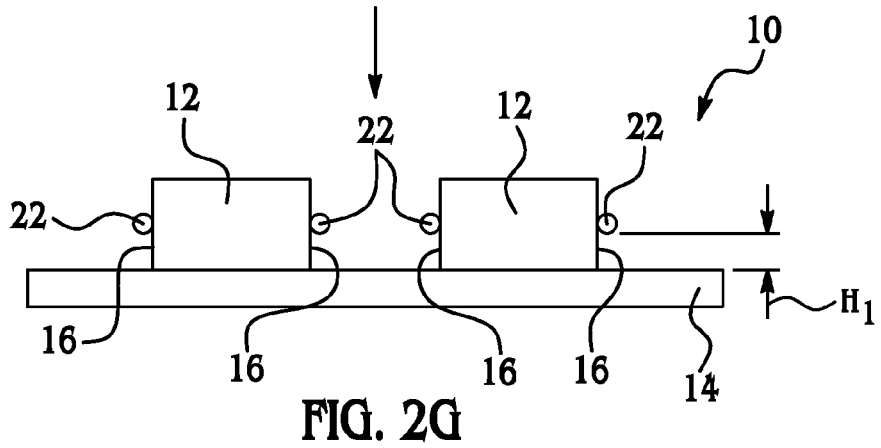

Referring now to FIGS. 2A through 2G, one embodiment of the method for controlling catalyst nanoparticle positioning is depicted. It is to be understood that the method results in the formation of the apparatus 10 (one embodiment of which is shown in FIG. 2G) for growing a nanowire. Once the nanowire is grown, the apparatus may be used in a variety of devices, including, but not limited to field effect transistors (FETs), p-n diodes, light emitting diodes (LEDs), nanowire-based sensors, other electronic, mechanical and/or optical devices, or combinations thereof.

FIG. 2A depicts two posts 12 established on a substrate 14. While two posts 12 are shown in FIG. 2A, it is to be understood that any desirable number of posts 12 may be formed on the substrate 14. The number of posts 12 formed depends, at least in part, on the desirable application for the apparatus 10. In one embodiment of the apparatus 10, one post 12 is desirable.

Each post 12 has at least one vertical sidewall 16. The posts 12 may be electrodes, cavity sidewalls, or any other object having at least one substantially vertical surface 16 upon which it is desirable to form a nanowire. The posts 12 may be formed from the substrate 14 (e.g., via patterning and etching), or from a layer formed on the substrate 14, or may be pre-formed and then established on the substrate 14. It is to be understood that in embodiments where the posts 12 are formed from the substrate 14 or from a layer on the substrate 14, the posts 12 are not considered to be part of the substrate 14 after their formation. As such, the substrate 14 in the final apparatus 10 is the portion that supports the posts 12.

One embodiment of forming the posts 12 is described by Islam, et al., "A Novel Interconnection Technique for Manufacturing Nanowire Devices," *Appl. Phys. A,* 80, 1133-1140 (March 2005), incorporated by reference herein in its entirety.

It is to be understood that any suitable substrate 14 may be used. Non-limiting examples of suitable substrates include Si, Ge, silicon-on-insulator (on a Si wafer) (SOI), germanium-on-insulator (on a Si wafer) (GOI), silicon-on-sapphire (SOS), silicon-on-ceramic (SOC), and/or the like, and/or combinations thereof.

In this embodiment of the method, a mask layer 18 is established such that it covers the posts 12 and the substrate 14, as shown in FIG. 2B. Any desirable material may be selected for the mask layer 18, non-limiting examples of which include oxides, resists, or the like, or combinations thereof. Deposition processes suitable for establishing the mask layer 18 include, but are not limited to low-pressure chemical vapor deposition (LPCVD), plasma enhanced chemical vapor deposition (PECVD), atmospheric pressure chemical vapor deposition (APCVD), or any other suitable chemical or physical vapor deposition techniques. In one non-limiting example, spin coating may be used to deposit spin-on-glass (SOG). In another non-limiting example, spin-coating or vapor deposition may be used to deposit organic polymers (e.g., photoresists).

After the mask layer 18 is established, it is anisotropically etched (e.g., via reactive ion etching) to expose a portion 20 of at least one of the vertical surfaces 16 of the posts 12. It is to be understood that a portion of the mask layer 18 remains on the substrate 14 and adjacent the posts 12 after etching is completed. Etching is accomplished until the remaining mask layer 18 has a height $H_1$ that corresponds to a minimum height for establishing the catalyst nanoparticle material. The minimum height is the lowest point on the vertical surface 16 of the post 12 at which the catalyst nanoparticle is to be positioned. The minimum height may be determined, at least in part, by a distance that is desirable between the ultimately formed nanowire and the substrate surface. As such, the minimum height (and thus height $H_1$) may vary as desired.

Referring now to FIG. 2D, catalyst nanoparticle material 22 is established on the posts 12, at least at the exposed portion 20 of the vertical surface 16 adjacent the remaining mask layer 18. As shown in FIG. 2D, the catalyst nanoparticle material 22 may be established to cover each exposed area of the posts 12. It is to be understood that the catalyst nanoparticle material 22 may be a layer of material that is subsequently annealed to form nanoparticles, or may be pre-formed catalyst nanoparticles (as shown in FIG. 2D). In either embodiment, suitable deposition processes include, but are not limited to physical deposition processes, solution deposition processes, chemical deposition processes, chemical vapor deposition processes, electrochemical deposition processes, and/or combinations thereof.

The catalyst nanoparticle material 22 may be any material suitable for initiating growth of nanowires. Non-limiting examples of such materials include gold, titanium, platinum, palladium, gallium, nickel, and/or combinations thereof.

FIG. 2E depicts the establishment of a second mask layer 24 on at least some of the catalyst nanoparticle material 22. As shown in FIG. 2E, while some of the catalyst nanoparticle material 22 has second mask layer 24 established thereon, other of the catalyst nanoparticle material 22 remains exposed. It is to be understood that the second mask layer 24 is established to substantially cover a desirable amount of the catalyst nanoparticle material 22 that will ultimately be used to form nanowires. As such, the second mask layer 24 essentially functions as a protective layer for at least some of the catalyst nanoparticle material 22.

It is to be understood that materials and methods of depositing and etching previously described for the mask layer 18 are suitable for the second mask layer 24.

As depicted in FIG. 2F, any catalyst nanoparticle material 22 that remains exposed after establishment of the second mask layer 24 is removed. Such a removal process may be accomplished by etching. Any suitable etching process that removes the material 22 without substantially affecting the second mask layer 24, the post 12 and/or materials on the post 12 may be used. Non-limiting examples of suitable etching processes include isotropic wet chemical etching, isotropic or at least partially non-directional plasma etching, and/or combinations thereof. It is to be understood that isotropic etching, at least partially isotropic etching, and partially isotropic etching techniques may be suitable alternatives for each other. For example, when it is stated that isotropic etching is a suitable technique, it is to be understood that at least partially isotropic etching and partially isotropic etching may also be suitable techniques for the embodiment being discussed. In an embodiment in which the second mask layer 24 is a polymer (e.g., an organic resist), an organic solvent removal process may be used.

After removal of the exposed catalyst nanoparticle material 22, the second mask layer 24 is removed, as shown in FIG. 2G. Such removal may be accomplished via an etching process that attacks the layer 24 without substantially affecting the remaining catalyst nanoparticle material 22. It is to be understood that the mask layer 18 may also be removed, if desired. Examples of such removal techniques include, but are not limited to wet chemical etching, dry etching, partially anisotropic etching, and/or combinations thereof.

As previously indicated, FIG. 2G depicts an embodiment of the apparatus 10 for forming a nanowire. Each apparatus 10 shown in FIG. 2G includes the post 12 and the catalyst nanoparticle material 22 established at a predetermined height (in this embodiment height $H_1$) on the vertical surface 16 thereof. Each apparatus 10 in FIG. 2G has two catalyst nanoparticles 22 established thereon. It is to be understood, however, that any desirable number of catalyst nanoparticles 22 may be attached on any number of the vertical surfaces 16.

In the embodiment of the method shown in FIGS. 2A through 2G, an oxide material may be used as the mask layer 18. In this embodiment, the method may further include planarizing the mask layer 18 after it is deposited on the posts 12 (FIG. 2B) and prior to etching (FIG. 2C). Such planarization may be accomplished via chemical mechanical polishing (CMP). This process is used to provide the mask layer 18 with a substantially flat surface (as shown in FIG. 2B). It is believed that the flat surface contributes to a well-controlled thickness $H_1$ of material 18 remaining after anisotropic etching (as shown in FIG. 2C).

Embodiments of the method may also include annealing the mask layer 18 prior to etching (FIG. 2C) or prior to removing the mask layer(s) 18, 24 (FIG. 2G). Without being bound to any theory, it is believed that annealing may improve the connection (adhesion) between the nanoparticles 22 and the post 12. Improved adhesion generally means that the nanoparticles 22 are less likely to be removed from the areas where they are desired when the masking materials 18, 24 are removed. Annealing may also agglomerate the catalyst nanoparticle material 22 that is deposited as a layer to form the desired nanoparticles. In a non-limiting example in which gold is used as the catalyst nanoparticle material 22 and silicon is used as the post 12, annealing may be accomplished at about 400° C.

Referring now to FIGS. 3A through 3L, another embodiment of the method for controlling the position of catalyst nanoparticle material 22 is depicted. In this embodiment, the catalyst nanoparticle material 22 is positioned in a gap 26 between a mask layer 28 and a third mask layer 30 (all shown in FIG. 3J).

Figure 3A:
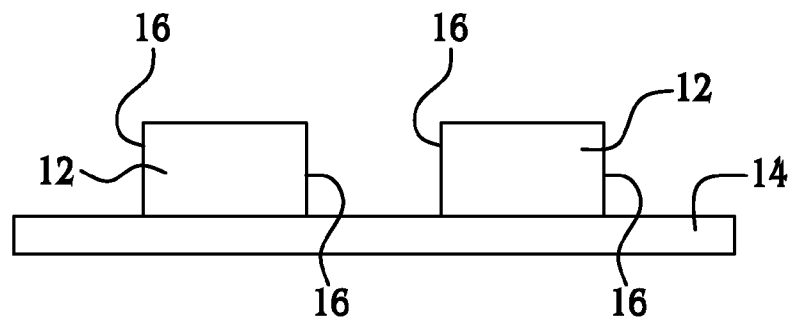
FIGS. 3A through 3L depict a schematic flow diagram of another embodiment of the method for controlling positioning of a catalyst nanoparticle.

FIG. 3A is similar to FIG. 2A in that two posts 12 (each having at least one vertical surface/sidewall 16) are formed on the substrate 14. As previously described, any number of posts 12 may be established on the substrate 14. The methods and materials described for posts 12 and substrate 14 may be used in this embodiment as well.

Figure 3B:
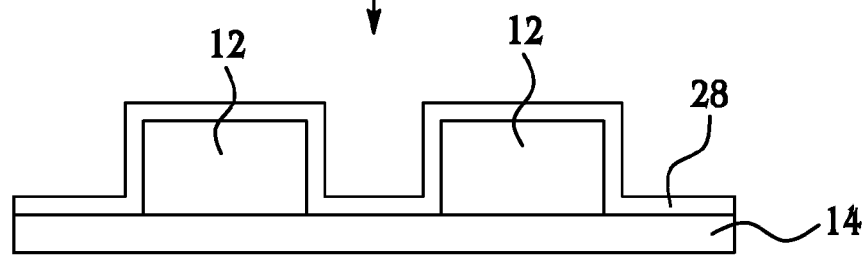

FIG. 3B depicts the conformal deposition of the mask layer 28 on the respective surfaces of the posts 12 and substrate 14. Suitable materials for the mask layer 28 include nitrides (e.g., silicon nitride), oxides (e.g., aluminum oxide), and/or combinations thereof. Such conformal deposition may be accomplished via conformal chemical vapor deposition. In some embodiments, advanced sputtering techniques may be used to conformally deposit the mask layer 28.

Figure 3C:
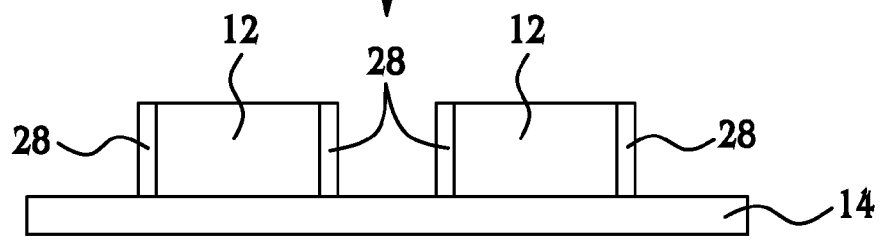

FIG. 3C depicts the selective removal of the mask layer 28. As depicted, the mask layer 28 is removed at least from the substrate surfaces, thereby leaving mask layer 28 covering the vertical surfaces 16. In some embodiments, the mask layer 28 is also removed from a top surface of the post 12. In a non-limiting example, anisotropic reactive ion etching may be used to selectively remove the mask layer 28.

Figure 3D:
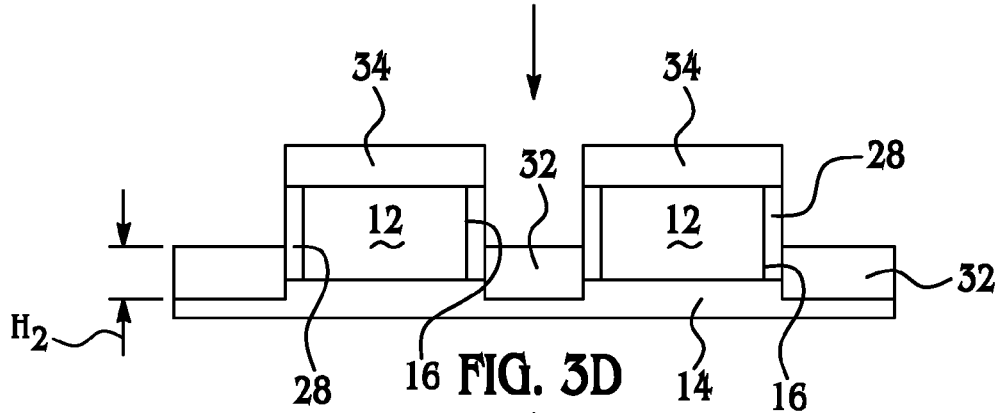

As shown in FIG. 3D, the exposed surfaces of the substrate 14 are oxidized to form an oxide 32 on the substrate surface. The embodiment shown in FIG. 3D also illustrates the exposed top surface of the post 12 being oxidized to form an oxide 34 on the post top surface. It is to be understood that the mask layer 28 substantially prevents the vertical surfaces 16 (and any other covered surfaces) from oxidizing. As such, the oxide 34 on the post top surface may not be formed if the mask layer 28 is allowed to remain on the top surface of the post 12.

The oxide 32 on the substrate surface has a height $H_2$ corresponding to a minimum height for establishing the catalyst nanoparticle material 22. As previously described, the minimum height is the lowest point on the vertical surface 16 of the post 12 at which the catalyst nanoparticle is to be positioned. The minimum height may be determined, at least in part, by a distance that is desirable between the ultimately formed nanowire and the substrate surface; and as such, the minimum height (and thus height $H_2$) may vary as desired.

Figure 3E:
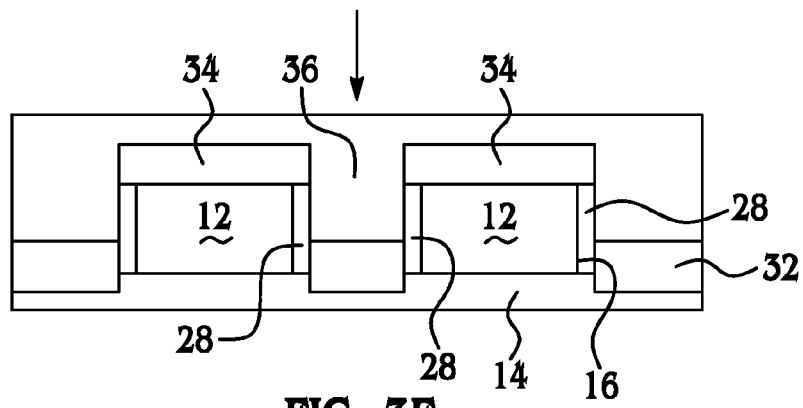
Figure 3F:
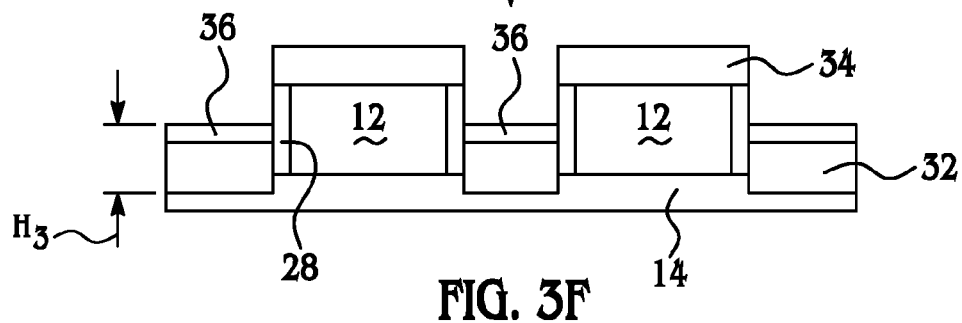

Referring now to FIGS. 3E and 3F, a second mask layer 36 is deposited to cover substantially the entire structure (FIG. 3E), and is then removed such that the remaining second mask layer 36 has a top surface corresponding to a maximum height $H_3$ for establishing the catalyst nanoparticle material 22 (FIG. 3F). The maximum height $H_3$ is the highest point on the vertical surface 16 of the post 12 at which the catalyst nanoparticle is to be positioned. In some embodiments, the post 12 is considered to extend to the bottom of the oxide 32 on the substrate surface. As such, and as shown in FIG. 3F, the height $H_3$ may be measured from the bottom of the oxide 32 on the substrate surface. Like the minimum height (corresponding to height $H_2$), the maximum height $H_3$ may be varied, as desired.

The second mask layer 36 may be a resist material, or any other material that is selectively removable compared to the oxide 32 on the substrate surface (and, if present, the oxide 34 on the post top surface). Any of the deposition techniques disclosed herein may be suitable for establishing the second mask layer 36. As a non-limiting example, reactive ion etching may be used to remove the desired portion of the second mask layer 36 such that its top surface is at the desirable maximum height $H_3$.

Figure 3G:
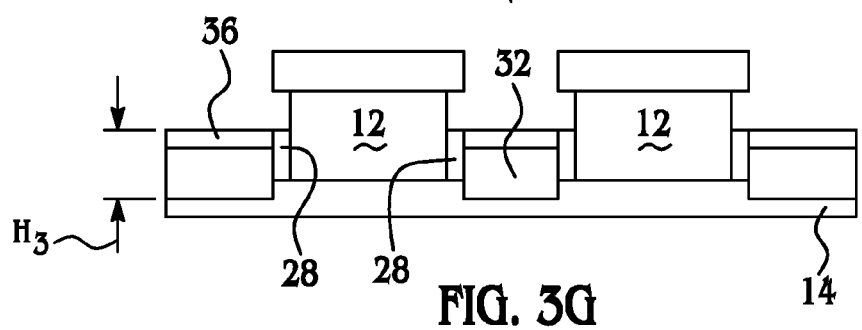

A portion of the mask layer 28 is then removed from the vertical surface 16 at areas above second mask layer 36, as shown in FIG. 3G. As depicted, each of the vertical surfaces 16 is exposed at an area that exceeds the maximum height $H_3$. Selective removal of this portion of the mask layer 28 is accomplished via chemically selective isotropic wet or dry etching.

Figure 3H:
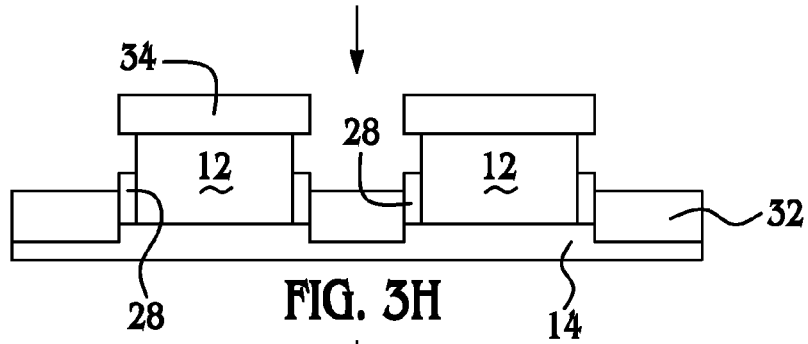
Figure 3I:
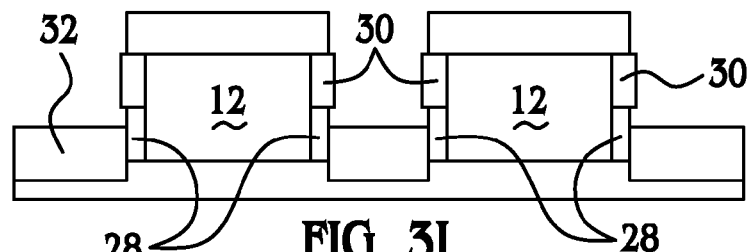

FIG. 3H depicts the subsequent removal of the remaining second mask layer 36. This may be accomplished by a material selective removal process, such as, for example, wet chemical etching or at least partially isotropic dry etching. After the second mask layer 36 is removed, the exposed portions of the vertical surfaces 16 are oxidized to form the third mask layer 30. The formation of the third mask layer 30 is shown in FIG. 3I. The mask layer 28 substantially protects the vertical surfaces 16 upon which it is established from oxidation.

Figure 3J:
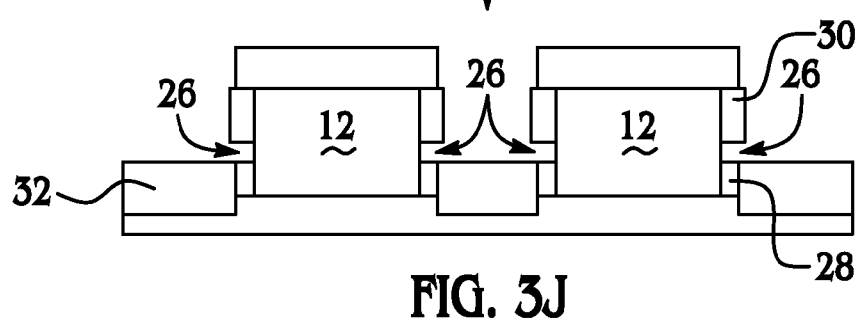

In some embodiments, the remaining second mask layer 36 is not removed until after the exposed portions of the vertical surfaces 16 are oxidized to form the third mask layer 30. Generally, in these embodiments, the second mask layer 36 is a high-temperature compatible material. In such embodiments, the remaining second mask layer 36 is removed after formation of the third mask layer 30 (FIG. 3I) and prior to formation of the gap 26 (FIG. 3J). It is to be understood, however, that if the second mask layer 36 is formed of a material that is not compatible with high temperatures (e.g., a photoresist material), the embodiment shown in FIG. 3H is suitable.

As previously indicated, FIG. 3J depicts the formation of the gap 26. The mask layer 28 positioned between the third mask layer 30 and the oxide 32 on the substrate surface is removed. This selective removal of the mask layer 28 forms the gap 26. Selective removal of the mask layer 28 may be accomplished by, for example, material selective wet chemical etching or isotropic dry etching. In a non-limiting example, if the mask layer 28 is silicon nitride, hot phosphoric acid ($H_3PO_4$) may be used to remove the mask layer 28 substantially without attacking the oxide 32 on the substrate surface or the posts 12. The size of the gap 26 may be made larger or smaller by altering the height of the oxide 32 on the substrate surface (see FIG. 3D), and/or the height of the top surface of the second mask layer 36 (see FIG. 3F). The size of the gap 26 may depend, at least in part, on the amount of catalyst nanoparticle material 22 (i.e., number of particles) to be established therein.

Figure 3K:
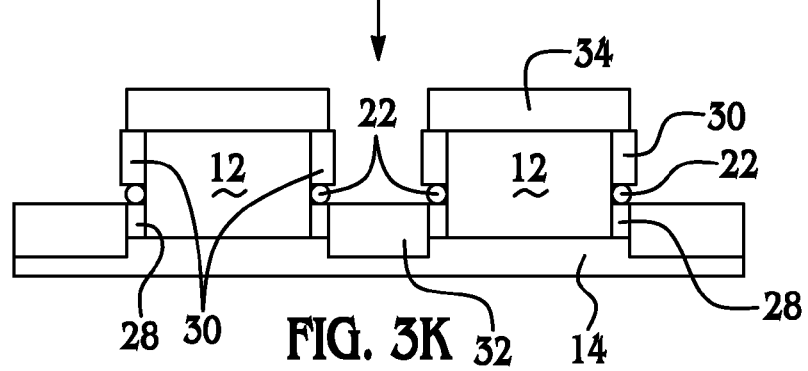

FIG. 3K depicts the selective deposition of the catalyst nanoparticle material 22 in the gap 26. In addition to the methods previously described, in this embodiment, selective deposition may be accomplished by selective chemical vapor deposition, selective electrochemical deposition, or selective attraction of pre-formed catalyst nanoparticles. A non-limiting example of selective deposition is discussed in Yasseri et al., "Growth and Use of Metal Nanocrystal Assemblies on High-density Silicon Nanowires Formed by Chemical Vapor Deposition," *Appl. Phys. A*, 82, 659-664 (2005), incorporated by reference herein in its entirety.

In another embodiment, the catalyst nanoparticle material 22 is deposited in the gap 26, on the oxide 32, on the mask layer 28, and on the third mask layer 30. This deposition is non-selective. In this embodiment, the catalyst nanoparticle material 22 established on the oxide 32, the mask layer 28, and the third mask layer 30 is removed substantially simultaneously with the respective oxide 32 or layer 28, 30.

Figure 3L:
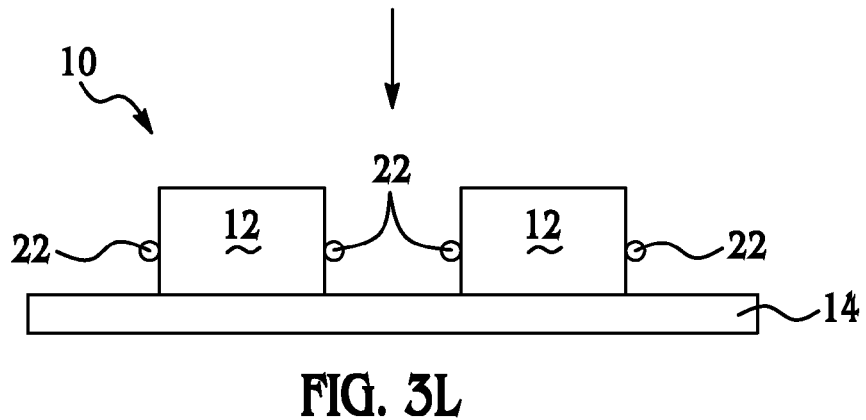

FIG. 3L depicts the removal of the respective oxides 32, 34, the mask layer 28, and the third mask layer 30. As a non-limiting example, at least partially isotropic wet or dry chemical etching may be used to remove the respective oxides 32, 34 and layers 28, 30.

FIG. 3L also depicts an embodiment of the apparatus 10 that is similar to the apparatus 10 formed via the method described in reference to the FIG. 2 series. Each apparatus 10 of FIG. 3L includes the post 12 and the catalyst nanoparticle material 22 established at a predetermined height (in this embodiment between height $H_2$ and height $H_3$) on the vertical surface 16.

Referring now to FIGS. 4A through 4C together, and FIGS. 4A, 4D, and 4E together, two additional embodiments for positioning catalyst nanoparticle material 22 are depicted. FIGS. 4A through 4C depict a top view of one embodiment of the method, and FIGS. 4A, 4D and 4E depict a top view of another embodiment of the method. In both embodiments, the top of post 12 is shown in FIG. 4A. It is to be understood that the post 12 may be formed on a substrate 14 as previously described herein.

FIGS. 4B and 4D illustrate the oxidation of the post 12 to form an oxide layer 38 thereon. Without being bound to any theory, it is believed that, near edges and corners 40 of the post 12, the oxide layer 38 grows at a different rate than at areas that are further from these features. As such, the oxidation results in one region of the oxide layer 38 having a thickness $T_1$ that is less than the thickness $T_2$ of another region. As shown in FIG. 4B, the thickness $T_2$ at the corner/edge 40 is the thicker region, and as shown in FIG. 4D, the thickness $T_1$ at the corner/edge 40 is the thinner region. The detailed shape and thicknesses are determined, at least in part, by a combination of differential oxygen supply and stress, oxidation conditions (e.g., linear or parabolic region, above or below viscous flow conditions for the oxide, and/or the like), and/or combinations thereof.

As shown in FIGS. 4C and 4E, the oxide layer 38 is then etched to remove the layer 38 from at least one of the regions of the post 12 where the oxide layer 38 is thinner. Both FIGS. 4C and 4D depict the oxide layer 38 removed from all of the thinner regions. As shown in these figures, portions of the oxide layer 38 may be allowed to remain at the thicker regions. In FIG. 4C, portions of the oxide layer 38 along the vertical surface 16 and away from the corners 40 are removed, and in FIG. 4E, portions of the oxide layer 38 along the edge/corner 40 are removed.

FIGS. 4C and 4E also depict the catalyst nanoparticle material 22 selectively established on one or more of the exposed areas of the post 12. Selective deposition of the material 22 may be accomplished by one of the techniques described hereinabove.

FIG. 4C depicts one embodiment of the apparatus 10', with the catalyst nanoparticle 22 established on each of the exposed vertical surfaces 16, and the oxide layer 38 remaining at thicker portions (along edges/corners 40). FIG. 4E depicts another embodiment of the apparatus 10', with the catalyst nanoparticle 22 established directly adjacent the corner/edge 40 of the post 12, and the oxide layer 38 remaining at thicker portions (e.g., along a substantial portion of vertical surfaces 16).

In any of the embodiments of the apparatus 10, 10' disclosed herein, an insulating layer (not shown) may be established between the post(s) 12 and the substrate 14 surface. This may be particularly desirable when a conductive substrate 14 is selected. Non-limiting examples of the insulating layer include oxides, nitrides, oxynitrides, and/or the like, and/or combinations thereof.

Furthermore, it is to be understood that the configuration of any of the layers disclosed herein may be altered such that the catalyst nanoparticle material 22 is positioned at any desirable location and/or in any desirable configuration. As non-limiting examples, the gap 26 may be formed such that the catalyst nanoparticle material 22 is located within a particular range of heights (e.g., the gap 26 resembles a stripe) on the vertical sidewall 16, or the oxide layer 38 may be removed such that the catalyst nanoparticle material 22 is located within a particular area (e.g., a continuous region) along the vertical sidewall 16 (e.g., the material 22 resembles a stripe).

As stated herein, embodiments of the apparatus 10, 10' may be used to form nanowires. Any suitable method for growing nanowires may be employed. Non-limiting examples of such methods are vapor-liquid-solid (VLS) and vapor-solid-solid (VSS). For either of these techniques, chemical vapor deposition is particularly suitable for supplying Si atoms. VLS is further described in Sharma et al, "Synthesis of Thin Silicon Nanowires using Gold Catalyzed Chemical Vapor Deposition," *Appl. Phys. A*, 80, 1225-1229 (March 2005), and Sharma et al, "Diameter Control of Ti-catalyzed Silicon Nanowires," *J. Crystal Growth*, 267, 613-618 (2004), both of which are incorporated by reference herein in their entirety. VSS is further described in Kamins et al., "Ti-Catalyzed Si Nanowires by Chemical Vapor Deposition: Microscopy and Growth Mechanisms," *J. Appl. Phys.*, 89, 1008-1015 (January 2001), incorporated by reference in its entirety.

While several embodiments have been described in detail, it will be apparent to those skilled in the art that the disclosed embodiments may be modified. Therefore, the foregoing description is to be considered exemplary rather than limiting.

What is claimed is:

1. A method for controlling catalyst nanoparticle positioning, the method comprising:
    establishing a mask layer on a post such that a portion of a vertical surface of the post remains exposed;
    establishing a catalyst nanoparticle material adjacent the mask layer and directly adjacent at least a portion of the exposed portion of the vertical surface; and
    removing at least a portion of the mask layer.

2. The method as defined in claim 1 wherein the post is established on a substrate, and wherein establishing the mask layer is accomplished by:
    depositing the mask layer on each surface of the post, thereby covering the post and at least a portion of the substrate adjacent the post; and
    anisotropically etching the mask layer to expose the portion of the vertical surface and a top surface of the post, whereby a remaining portion of the mask layer has a height corresponding to a minimum height for establishing the catalyst nanoparticle material.

3. The method as defined in claim 2 wherein the catalyst nanoparticle material is established on each exposed surface of the post.

4. The method as defined in claim 3, further comprising:
    establishing a second mask layer on at least a portion of the catalyst nanoparticle material;
    removing any exposed catalyst nanoparticle material; and
    removing the entire mask layer and the second mask layer, thereby exposing any remaining catalyst nanoparticle material.

5. The method as defined in claim 4 wherein the mask layer is an oxide layer, and wherein the method further comprises:
    planarizing the mask layer prior to anisotropically etching the mask layer; and
    annealing the mask layer prior to anisotropically etching the mask layer or removing the mask layer.

6. The method as defined in claim 4 wherein the mask layer is a resist layer.

7. The method as defined in claim 1 wherein the post is established on a substrate, and wherein establishing the mask layer is accomplished by:
    depositing the mask layer on an exposed surface of the substrate and on the vertical surface of the post;
    removing a portion of the mask layer from the substrate surface;
    oxidizing the exposed substrate surface, thereby forming an oxide on the substrate surface having a height corresponding to a minimum height for establishing the catalyst nanoparticle material;
    depositing a second mask layer on the mask layer and on the oxide on the substrate surface;
    removing at least a portion of the second mask layer such that a remaining portion of the second mask layer has a top surface corresponding to a maximum height for establishing the catalyst nanoparticle material;

removing a portion of the mask layer from the vertical surface that exceeds the maximum height, thereby exposing an other portion of the vertical surface;

oxidizing the other exposed portion of the vertical surface, thereby forming a third mask layer; and removing the mask layer from an area located between the third mask layer and the oxide on the substrate surface, thereby forming a gap between the mask layer and the third mask layer and exposing the portion of the vertical surface which is located at the gap.

8. The method as defined in claim 7, further comprising removing any remaining second mask layer prior to oxidizing the other exposed portion of the vertical surface or after oxidizing the other exposed portion of the vertical surface.

9. The method as defined in claim 7 wherein after the catalyst nanoparticle material is established in the gap, the method further comprises removing the entire mask layer, removing the third mask layer, and removing the oxide on the substrate surface.

10. The method as defined in claim 9 wherein establishing the catalyst nanoparticle material is accomplished by depositing the material in the gap, on the mask layer, on the third mask layer, and on the oxide on the substrate surface, and wherein the method further comprises removing the catalyst nanoparticle material established on the mask layer, on the third mask layer, and on the oxide on the substrate surface substantially simultaneously with removing the mask layer, the third mask layer, and the oxide on the substrate surface.

11. The method as defined in claim 7 wherein establishing the catalyst nanoparticle material is accomplished by selectively depositing the material in the gap.

12. The method as defined in claim 1 wherein establishing the mask layer is accomplished by:

oxidizing surfaces of the post, thereby forming an oxide layer having at least one region that is thinner than at least one other region; and removing the oxide layer at the at least one region that is thinner than the at least one other region, thereby exposing the portion of the vertical surface.

13. The method as defined in claim 12 wherein the oxide layer remains at the at least one other region.

14. The method as defined in claim 1, further comprising growing a nanowire from the at least a portion of the exposed portion of the vertical surface having the catalyst nanoparticle material established thereon.

* * * * *